(12) United States Patent
Kawamura (10) Patent No.: US 9,023,432 B2
(45) Date of Patent: May 5, 2015

(54) RESIST MATERIAL FOR IMPRINTING, PATTERN FORMATION METHOD, AND IMPRINTING APPARATUS

(75) Inventor: Daisuke Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,677

(22) Filed: Mar. 20, 2012

(65) Prior Publication Data

US 2013/0059090 A1  Mar. 7, 2013

(30) Foreign Application Priority Data

Sep. 1, 2011  (JP) ................. 2011-190959

(51) Int. Cl.
| | |
|---|---|
| *C08J 7/04* | (2006.01) |
| *B05D 3/12* | (2006.01) |
| *B05D 3/06* | (2006.01) |
| *G03F 7/00* | (2006.01) |
| *C09D 133/08* | (2006.01) |
| *B82Y 10/00* | (2011.01) |
| *B82Y 40/00* | (2011.01) |

(52) U.S. Cl.
CPC B05D 3/12 (2013.01); B05D 3/067 (2013.01); G03F 7/0002 (2013.01); C09D 133/08 (2013.01); *C08J 7/042* (2013.01); *C08J 2433/08* (2013.01); *C08J 2463/00* (2013.01); B82Y 10/00 (2013.01); B82Y 40/00 (2013.01)

(58) Field of Classification Search
None
See application file for complete search history.

(56) References Cited

U.S. PATENT DOCUMENTS

| | | | | |
|---|---|---|---|---|
| 7,077,992 | B2 * | 7/2006 | Sreenivasan et al. | 264/496 |
| 7,157,036 | B2 * | 1/2007 | Choi et al. | 264/264 |
| 2005/0187339 | A1 * | 8/2005 | Xu et al. | 524/556 |
| 2007/0228593 | A1 | 10/2007 | Jones et al. | |
| 2008/0042319 | A1 * | 2/2008 | Ando et al. | 264/293 |
| 2008/0308971 | A1 * | 12/2008 | Liu et al. | 264/293 |
| 2009/0148619 | A1 | 6/2009 | LaBrake et al. | |
| 2009/0273124 | A1 * | 11/2009 | Okinaka et al. | 264/496 |
| 2010/0072667 | A1 * | 3/2010 | Kawakami et al. | 264/299 |
| 2010/0081224 | A1 * | 4/2010 | Yanagisawa | 438/32 |
| 2010/0096764 | A1 * | 4/2010 | Lu | 264/39 |
| 2010/0112310 | A1 | 5/2010 | Truskett et al. | |
| 2010/0219548 | A1 | 9/2010 | Mori et al. | |
| 2012/0148809 | A1 * | 6/2012 | Kobayashi et al. | 428/195.1 |

FOREIGN PATENT DOCUMENTS

| | | |
|---|---|---|
| JP | 2007-266308 A | 10/2007 |
| JP | 2010-199496 | 9/2010 |

(Continued)

OTHER PUBLICATIONS

M. Fang; How is Inkjet Printing Done; Science 2.0; Apr. 2010; http://www.science20.com/mei/how_inkjet_printing_done.*

(Continued)

*Primary Examiner* — Timothy Meeks
*Assistant Examiner* — Michael P Rodriguez
(74) *Attorney, Agent, or Firm* — Finnegan, Henderson, Farabow, Garrett & Dunner, LLP (57) ABSTRACT

According to one embodiment, an resist material for imprinting comprises a first resin component nonvolatile at a substrate on which to form an imprinting pattern, a second resin component volatile at the substrate, and a coupling reaction initiator that promotes curing of the first resin component.

5 Claims, 4 Drawing Sheets

(56) References Cited

FOREIGN PATENT DOCUMENTS

| JP | 2010-287793 A | 12/2010 |
| WO | WO 2011024673 A1 * | 3/2011 |

OTHER PUBLICATIONS

ChemSpider ethyleneglycol diacrylate—retrieved from http://www.chemspider.com/Chemical-Structure.67824.html on Jun. 11, 2014.*

ChemSpider hexyl acrylate—retrieved from http://www.chemspider.com/Chemical-Structure.16338.html on Jun. 11, 2014.*

Dow Product Information—Hydroxyethyl Acrylate.*

LookChem isobornyl acrylate—retrieved from http://www.lookchem.com/Isobornyl-acrylate/ on Jun. 11, 2014.*

Haisma, Jan et al., "Mold-assisted nanolithography: A process for reliable pattern replication", J. Vac. Sci. Technol. B 14(6), pp. 4124-4128 (Nov./Dec. 1996).

First Office Action issued by Japanese Patent Office in corresponding Application No. 2011-190959 mailed May 7, 2014, 5 pages.

* cited by examiner

RESIST MATERIAL FOR IMPRINTING, PATTERN FORMATION METHOD, AND IMPRINTING APPARATUS

CROSS-REFERENCE TO RELATED APPLICATIONS

This application is based upon and claims the benefit of priority from prior Japanese Patent Application No. 2011-190959, filed Sep. 1, 2011, the entire contents of which are incorporated herein by reference.

FIELD

Embodiments described herein relate generally to a resist material for imprinting, a pattern formation method, and an imprinting apparatus.

BACKGROUND

Various UV imprint lithography methods using UV-curable resin as photo-curable resin are available. In one these methods, ink-jetting, for example, is performed, discretely applying the resist material into spaces made in the surface of a substrate. This method is advantageous in that the resist is applied at designated positions in a required amount in accordance with the arrangement of patterns on a template, whereby the resist film remaining between the template and the substrate can have is so-called residual layer thickness (RLT) that is uniform for the patterns. The technique of imparting uniform thickness to the resist film of RLT is useful in increasing the dimensional precision of the patterns processed.

In order to form fine patterns, the resist pattern must have a small height (i.e., small thickness). Otherwise, the resist pattern may be broken when the template is separated from resist, or the resist material may not fill the spaces on the template. If the resist pattern becomes thin, the RLT must be reduced to compensate for the inadequate thickness of the resist film, i.e., process mask used in processing the film formed on the substrate.

To form a resist pattern of a small height and to reduce the RLT, however, the amount of the resist applied in any specific region must be decreased. The total amount of resist discretely applied in that region, discretely, or in the form of droplets, should therefore be decreased. In view of the pattern dimension precision due to the variation of the RLT, it is not desirable to place the resist droplets merely sparsely. It is indeed desired that the resist droplets should be reduced in volume. For the size of resist droplets to apply onto the substrate, however, the lower limit exists because of the restriction imposed on the ink-jet head.

If the main component of the resist material is a volatile one, as in the case of UV-curable resin of radical polymerization type, the resist applied from the ink-jet nozzle can indeed be reduced in volume. However, the main component evaporates in different amounts in the respective unit regions at which the imprinting is performed once by using the template.

DETAILED DESCRIPTION

In general, according to one embodiment, a resist material comprises a first resin component, a second resin component, and a coupling reaction initiator. The first component that is nonvolatile at a substrate on which to imprint patterns. The second resin component is volatile at the substrate. The coupling reaction initiator promotes the curing reaction of the first resin component.

Various embodiments will be described hereinafter with reference to the accompanying drawings.

First Embodiment

With regard to an embodiment, a resist material for imprinting achieved by means of imprint lithography will be described. The resist material is one that is discretely applied to a substrate, particularly by using an ink-jet nozzle.

In the imprint lithography performed in the manufacture of an LSI, a stamp called a template, which has a desired pattern (negative image) formed on it, is pressed onto the resist material applied on the substrate, thereby obtaining the desired pattern (positive image). The imprint lithograph is classified into two major types: thermal imprint type and photo-imprint type. The photo-imprint type can be used to produce fine elements with interconnects that should be overlaid with high positional precision, because the resist material need not be heated to be cured. UV print using UV-curable resin, a kind of photo-curable resin, is particularly considered advantageous.

The resist material for ordinary imprinting is the UV-curable resin which is made mainly of a first resin component having no volatility and able to undergo radical polymerization and which contains a photo-radical generating agent used as reaction initiator. The UV-curable resin should better further contain an additive that controls the surface energy state, the separation property of the template, and also the adhesive property with respect to the template. This embodiment is characterized in that the UV-curable resin further contains a volatile resin as second resin component.

That is, the resist material used in this embodiment comprises a first resin component essentially nonvolatile at the substrate on which to form an imprint pattern, a second resin component essential volatile at the substrate, and a coupling reaction initiator for promoting the curing of the first resin component.

Note that UV-curable resins are classified into radical polymerized type and cation-polymerized type. The cation-polymerized type contains a derivative such as epoxy, oxetane or vinyl ether, as main component, and further contains a photoacid generator, as polymerization initiator, and some additives. The radical polymerized type contains, as main component, monomer or oligomer having vinyl group or (meta) acrylic group that can undergo radical polymerization, and further contains a photo-radical generator and some additives. If irradiated with light, the curable component of radical polymerized type undergoes chain polymerization because the radical generated from a photo-polymerization initiator acts on the vinyl group, promoting the chain polymerization and ultimately forming a polymer. If a polyfunctional monomer or oligomer having two or more function-groups is used, a crosslinked structure can be obtained. Any UV-curable resin of radical polymerized type, which is cured quickly, is considered useful in UV imprinting.

A method of using the imprint material according to this embodiment will be described below.

Before applying the resist material to the substrate, the volumetric change of the second resin component, due to the evaporation of this resin component, is taken into account with respect to the amount in which the resist should be applied. More specifically, the volumetric percentages of the first resin component having no volatility, second resin component having volatility, and third component, i.e., radial generator and additive for controlling the adhesive property, are set to A %, B % and C % (A+B+C=100%). In practice, if the third component, i.e., additives, is used in a large amount, the resist pattern will be not so strong or resistive to etching. In view of this, component C has a volumetric percentage of 10% or less in most cases.

If the entire second component evaporates, the volume of the resist material will be (A+C) %. Hence, if the resist should be applied to a certain position in the amount of m [pL], the amount of resist to eject from, for example, an ink-jet nozzle, is m×100/(A+C) [pL].

The smallest amount in which any material can be applied from the ink-jet head available at present is about 1 pL at present. Therefore, the existing resist composed of the first resin component (A %) and the third component (C %) can hardly be applied onto the substrate, in the form of droplets of 0.1 pL. In contrast, the resist material contains the second component having volatility in a sufficient amount, in addition to the first and third components in this embodiment. Resist droplets of about 0.1 pL can be placed on the substrate even from an existing ink-jet head that applies the material in the form of droplets of about 1 pL.

Figure 1A:
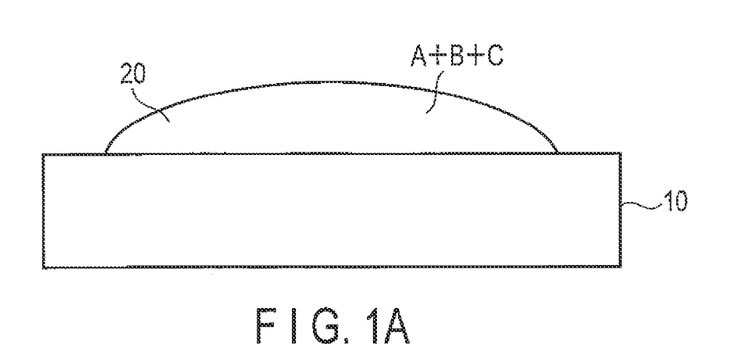
FIG. 1A and FIG. 1B are sectional views explaining the resist material used in a first embodiment, and showing how a resist droplet changes in volume as the resist material evaporates.
Figure 1B:
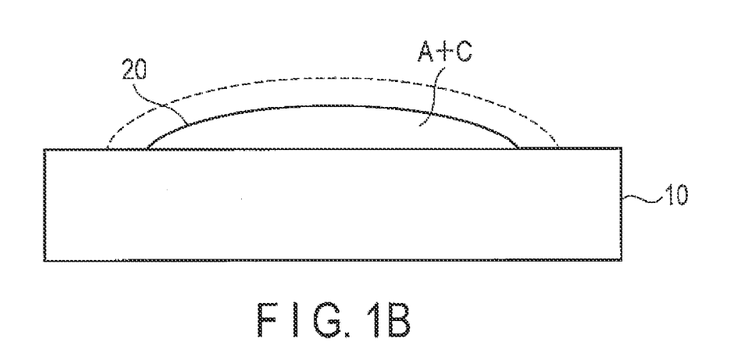

FIG. 1A shows a resist droplet 20 formed on the surface of a substrate 10 by using an ink-jet head. The resist droplet 20 is composed of component A, component B, and component C. FIG. 1B shows the resist droplet 20 from which the second resin component B has been evaporated, either by leaving the resist droplet 20 to stand or by positively evaporating component B though heating. Since the resin component B has been evaporated, the resist droplet 20 has a smaller volume. At this point, the resin droplet 20 is composed of component A and component C, i.e., A+C.

On the other hand, the existing resist material hitherto used is composed of the second resin component resin component B (B %) having volatility and the third resin component. Assume that a resin droplet composed of the existing resist material is formed on the substrate. Then, the resin droplet keeps changing in volume until the resin is cured by means of UV application. If resist droplets are formed at different times, on a designated part of the substrate, which will be pressed with the template later, the time for which the volumetric change continues will be different, from one position to another in the designated part. Further, since the evaporation is a natural phenomenon that depends on the surface areas of resin droplets, the rates at which the respective resin droplets evaporate differs from one another, because the resist droplets have different volumes (or surface areas). Because of these various factors, the calculation of the amount in which to eject the resin material onto the substrate becomes complex. As a result, the resist material may be applied in the form of droplets, but at low volumetric precision.

In the method according to this embodiment, the resist material applied reduces in volume, depending on its initial volume only, if the second component fully evaporates. Moreover, the resist droplet finally remaining on the substrate have the same volume, no matter where they exist in the designated part of the substrate, which will be pressed with the template later. This increases the volumetric precision of resin forming each droplet on the substrate, ultimately enhancing the pattern dimension precision.

Figure 2:
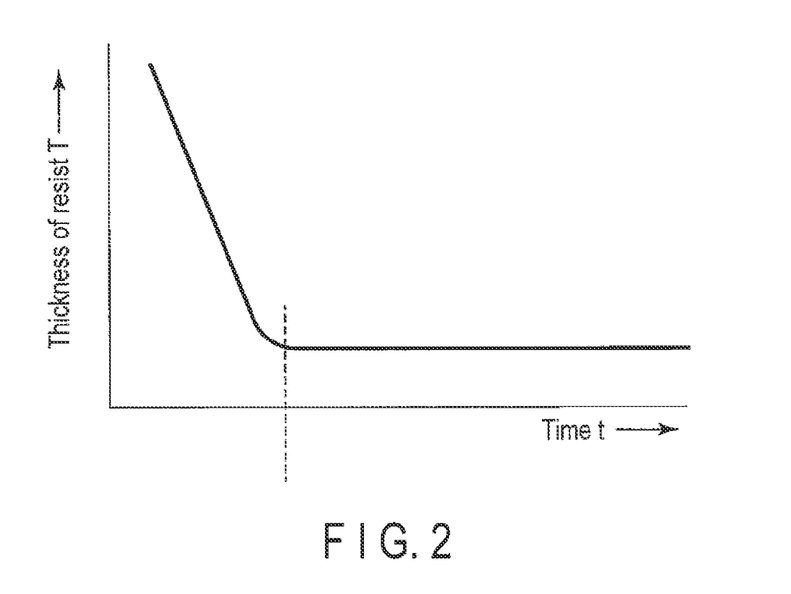
FIG. 2 is a diagram showing the relation between the size of a resist droplet and the time elapsed after the resist droplet has been formed.

FIG. 2 is a diagram showing the relation between the size of a resist droplet and the time elapsed after the resist droplet has been formed. The resist droplet may be left to stand at room temperature. Alternatively, it may be heated. In this case, the second resin component B quickly evaporates, making the resin droplet smaller very quickly. Once the second resin component B has evaporated, the thickness of the resist layer will scarcely change. That is, if the resist droplet is left to stand or heated for a time longer than a prescribed value, the deposition of the resist droplet can be well controlled.

The first resin component is resin material that has no volatility in effect at room temperature. More precisely, the first resin component is either a specified acrylate derivative or a specified unsaturated polyester derivative. Preferably, it is a specified acrylate derivative. The derivative may be one having a boiling point of 100° C. or more, because it has no volatility in effect at room temperature. As such a derivative, alicyclic acrylate, t-butyl acrylate, ethylcarbutylol acrylate, and phenoxyethyl acrylate can be exemplified.

The second resin component is resin material that has volatility in effect at room temperature. More precisely, the second resin component is an acrylate derivative or an epoxy, either having a boiling point of 100° C. or less. As such a derivative, 2-hydroxyethyl acrylate, 2-hydroxybutyl acrylate, tetrafurfuryl acrylate, and alicyclic epoxy can be exemplified. Of resin components having high volatility, some may possibly harmful to human being. The second resin component and impurities contained in it, even in a trace, must therefore be checked for safety, before this resin component is put to industrial use. In view of the nature of this embodiment, however, the second resin component is not limited to the examples specified here.

Examples of the radical generator are: 2,4,6-trimethyl-diphenyl phosfineoxy, 2,2-dimethoxy-2-phenylacetophenone, 2-methyl-1-[4-(methylthio)phenyl]-2-morpholino-propane-1-on, 2-benzyl-2-dimethylamino-1-(4-morpholinophenyl)-1-butanone, 2-(dimethylamino)-2-[4-methoyphenyl]methyl-1-[4-(4-morpholinyl)phenyl)-1-butanone, and 2-hydroxy-2-methyl-1-phenyl-propane-1-on. In view of the nature of this embodiment, however, the radical generator is not limited to these example.

As has been described, in the first embodiment, the resist material for imprinting is made of a first resin component having no volatility, a second resin component having volatility, and a coupling reaction initiator for promoting the curing of the first resin component. A thin resist film can therefore be formed on a substrate and imprinted and controlled in terms of thickness. Hence, the resist film can contribute to the enhancement of the dimensional precision of the pattern formed by imprinting.

Second Embodiment

An imprinting process using the resist material according to a second embodiment will be explained.

FIG. 3A to FIG. 3D are sectional views explaining the imprinting process according to this embodiment.

Figure 3A:
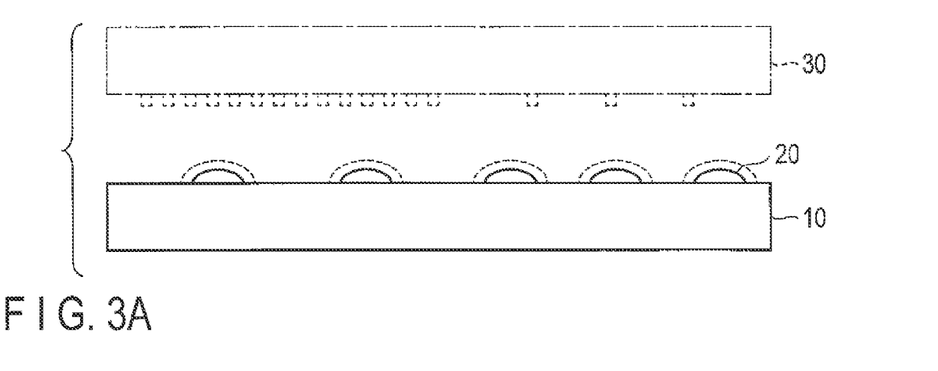
FIG. 3A to FIG. 3D are sectional views explaining a pattern formation method according to a second embodiment.

First, the number of resist droplets and the density thereof, which should be applied to each region on a substrate before the impressing of a template, is calculated from the pattern data on the template. As described in conjunction with the first embodiment, the number of resist droplets and the density thereof, which should be applied to the substrate by using an ink-jet nozzle, are calculated from the ratio of the second resin component (volatile component) of the resist material or the correction value based on experimental data. The resist is elected from the nozzle in accordance with the data thus calculated, thereby forming resist droplets 20 on the substrate 10 as shown in FIG. 3A. The resist droplets are applied in a small number to any region having a dense pattern, and in a large number to any region having a sparse pattern. Further, the resist droplets have the same volume, no matter whichever part of the substrate they are applied.

Figure 3B:
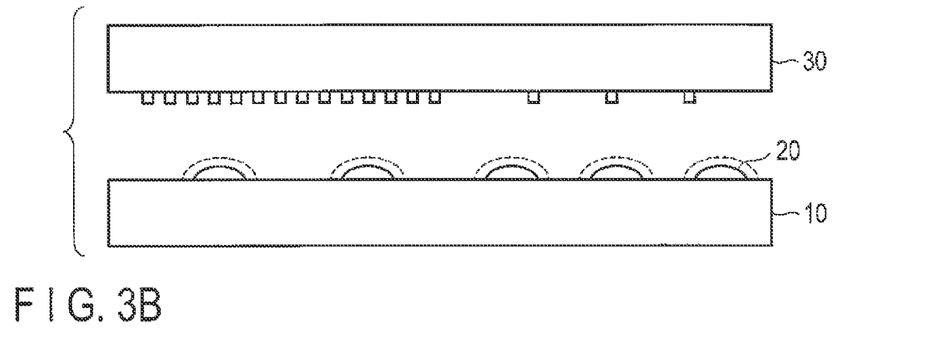

Next, as shown in FIG. 3B, an evaporating step is performed, evaporating almost all second resin component of each resist droplet 20 formed on the substrate 10. As a result, the thickness of each resist droplet 20 decreases.

Figure 3C:
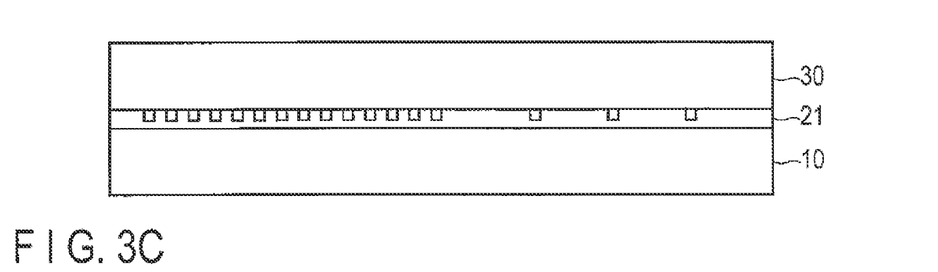

After the second resin component has evaporated, and after the resist composed of the first resin component (nonvolatile component) and the third component have come to have a total amount calculated from the pattern formed on a template 30, an impressing step is performed by using the template 30 as shown in FIG. 3C. A pattern of resist 21, which is inverse to the pattern of the template 30, is thereby formed on the substrate 10. At same time that the template 30 is pressed, or after a certain time lag, UV beams are applied to the pattern of the resist 21, curing the resist.

Figure 3D:
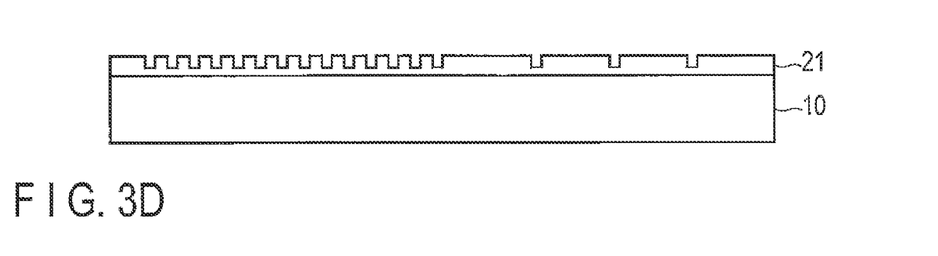

Next, as shown in FIG. 3D, the template 30 is separated from the pattern of the resist 21 thus cured. A desired resist pattern is thereby produced.

The evaporation of the second resin component contained in each resist droplet 20 should be taken into consideration. That is, it is necessary to determine how each resist droplet 20 changes in size (or the size of interface with the substrate) on the substrate 10 until the template 30 is pressed onto the substrate in an atmosphere (temperature, pressure, and water content). The time between the placing of the template on the resist material and the pressing of the template onto the resist material (i.e., time the second resist component requires to evaporate) is calculated from the data representing the sequence of applying the resist material to the region covered with the template, the positions the resist material take on the substrate and the experimental, data representing how the resist droplets change in volume with time. More simply, it is assume that the resist is applied to the regions of the substrate, in a specific order, and that more resist is applied in the last region than in any other region. Then, the time the largest resin droplet needs to decrease in volume sufficiently can be used as the time the second resin component needs to evaporate after the completion of resist material application until the template is pressed onto the resist material.

The volumetric reduction of any resist droplet therefore depends on the initial volume only, as described in conjunction with the first embodiment. Further, the resin droplets have the same final volume, regardless of the positions where they are pressed with the template. This increases the volumetric precision of resin forming each droplet on, ultimately enhancing the pattern dimension precision.

Third Embodiment

An imprinting apparatus according to a third embodiment will be described. This apparatus is designed to perform the imprinting process according to this embodiment.

Figure 4:
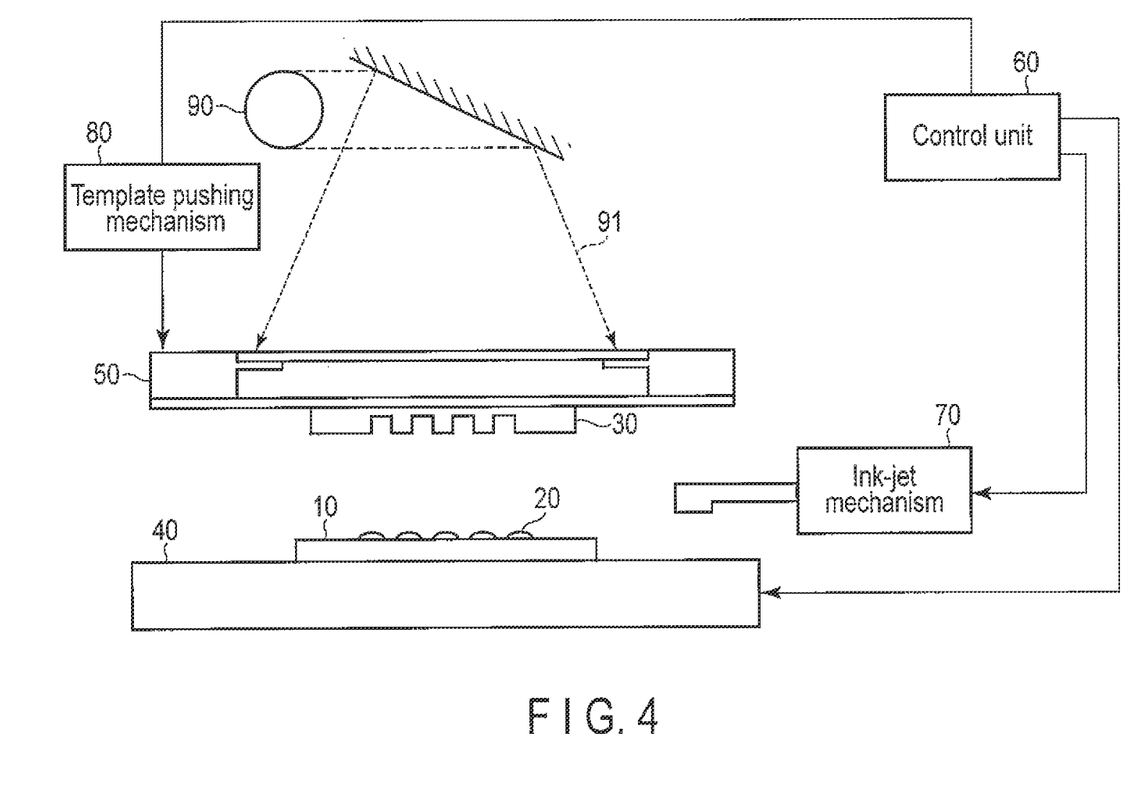
FIG. 4 is a schematic diagram showing an imprinting apparatus according to a third embodiment.

FIG. 4 is a schematic diagram showing the imprinting apparatus according to this embodiment.

In FIG. 4, reference number 40 designates a stage holding a substrate 10 on which to form an imprint pattern. The stage 40 can be moved in the X-direction (left and right) and in the Y-direction (perpendicular to the plane of drawing).

A template holding mechanism 50 is arranged, facing the upper surface of the stage 40. A template 30 having an LSI pattern is secured to the lower surface of the template holding mechanism 50. The template holding mechanism 50 can be moved up and down by a template pushing mechanism 80 that operates in accordance with instructions coming from a control unit 60. Above the template holding mechanism 50A, a UV light source 90 is provided. The UV light source 90 emits UV light 91. The UV light 91 passes through the template 30 and is applied to the surface of the substrate 10.

Above the stage 40, an ink-jet mechanism (resist application mechanism) 70 is arranged. The ink-jet mechanism 70 operates in accordance with instructions coming from the control unit 60. The ink-jet mechanism 70 is configured to apply a prescribed amount of resist to any designated position on the substrate 10.

The imprinting apparatus further comprises an alignment mechanism (not shown) configured to align the template 30 with the substrate 10, a transport mechanism (not shown) configured to transport the substrate 10, a template exchanging mechanism (not shown), and a resist-amount/position designation unit (not shown) configured to designate the amount and position in and at which to apply resist material.

Note that the units of position, at which the template is pressed onto the resin, are called shots. After the resist is applied to a certain shot, the template is pressed at the unit. While the template is being pressed onto the resin, the application of resist at the next shot is started.

The resist application mechanism of a typical type comprises one or more ink-jet nozzles arranged for a distance equivalent to the width of the template, in a direction perpendicular to the first drive direction that is one of the directions defining the shape of the shot region. The resist application mechanism may be of another type in which the nozzles can be moved not only in the first drive direction, but also in a direction perpendicular to the first drive direction.

The second resists requires time $t_{v2}$ to evaporate after the template has been placed on the resist material until the template is pressed onto the resist material, as described in conjunction with the second embodiment. Further, time $t_{put}$ is required to apply the resist to one shot. Thus, in order to make the second resin component fully evaporate, thereby to achieve the advantage described in conjunction with the second embodiment, the template must be pressed onto the shot ahead the shot where the resist is being applied, by an integer greater than or equal to $t_{v2}/t_{put}$.

If $t_{v2}/t_{put}=3$, the volume of the resist droplet may not decrease enough to press the template immediately after the resist has been applied at one shot. In this case, it suffices to push the template after the resist material has been applied at a plurality of shots. For example, the resist may be repeatedly applied at shots 1, 2, 3, . . . in the order mentioned, and the template may be pressed at shot 1 after applying the resist at shot 4, and pressed at shot 2 after applying the resist at shot 5.

Thus, in this embodiment, the ink-jet mechanism 70 forms resist droplets 20 at the respective shots on the substrate 10, and the template 30 is pressed onto the resist droplets 20 formed at the respective shots after the second resin component has evaporated. Since the resin droplets 20 are maintained uniformly thin before the template is pressed, the pattern dimension precision can be greatly enhanced.

Fourth Embodiment

An imprinting apparatus according to a fifth embodiment, which is designed to perform the imprinting process according to the second embodiment, will be described with reference to FIG. 5.

Figure 5:
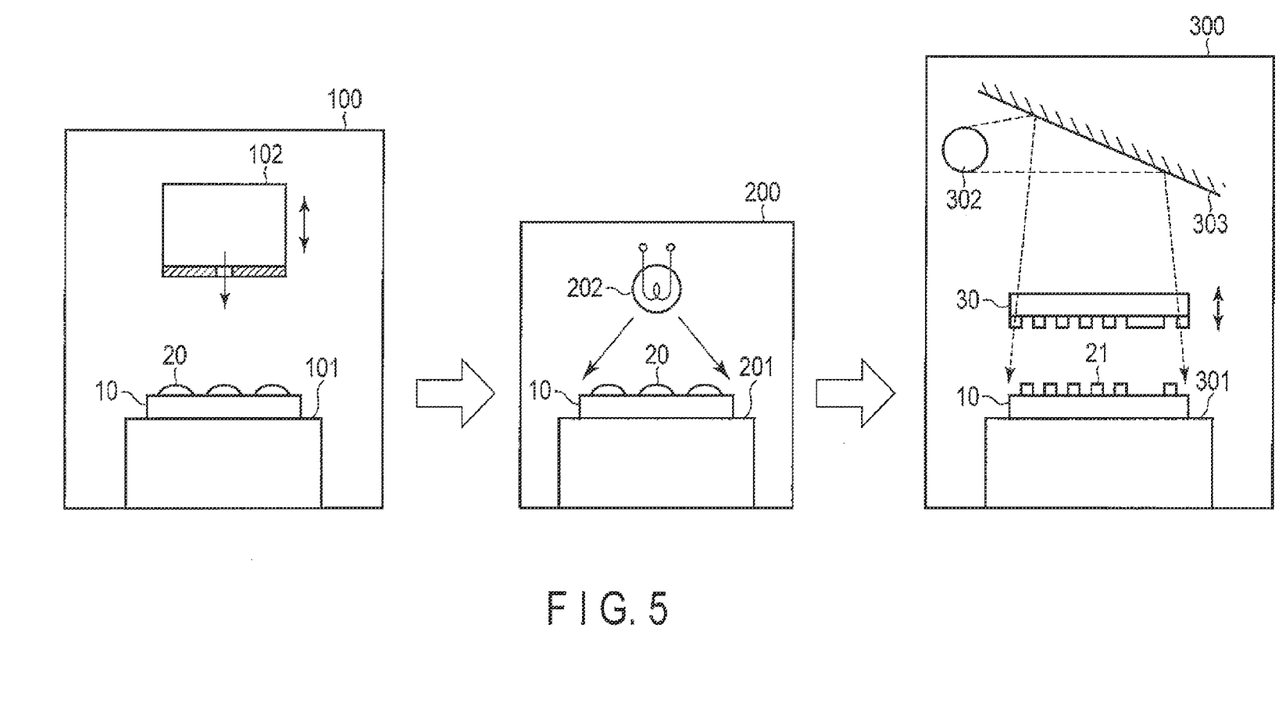
FIG. 5 is a schematic diagram showing an imprinting apparatus according to a fourth embodiment.

FIG. 5 is a schematic diagram showing an imprinting apparatus according to a fourth embodiment.

The apparatus has a first chamber 100. In the first chamber 100, a stage 101 and a resist application mechanism 102 are provided. The stage 101 holds a substrate 10. The resist application mechanism 102 is configured to apply a prescribed amount of resist at a designated position on the substrate 10. The resist application mechanism 102 is, for example, an ink-jet mechanism. A resist amount designation unit (not shown) is provided, which is configured to designate the amount in which to apply resist material, in accordance with the mask pattern formed on a template 30. Further, an alignment mechanism is provided, which aligns the substrate by detecting the notched part of the substrate 10. If required in view of the positional precision required of the resist application mechanism, an alignment mechanism must be used, which aligns the substrate 10 in accordance with the multi-layer interconnect alignment mark printed on the substrate 10.

The apparatus further has a second chamber 200. In the second chamber 200, a stage 201 and an infrared heater 202 are provided. The stage 201 holds a substrate 10. The infrared heater 202 is configured to heat the substrate 10. The chamber 200 functions as a resist-volume reduction mechanism. The chamber 200 must be evacuated enough to prevent the contamination with the evaporated second resin component.

The apparatus further has a third chamber 300. In the third chamber 300, a stage 301, a template 30, a UV light source 302, and a mirror 303 are provided. The stage 301 holds a substrate 10. The template 30 is used to perform imprinting on the resist droplets formed on the substrate 10. The UV light source 302 emits UV light, and the mirror 303 reflects the UV light, applying the same to the resist on the substrate 10. Further, an alignment mechanism (not shown) for aligning the template 30 with the substrate 10, and a template exchanging mechanism (not shown) for exchanging the template 30 with another are provided in the third chamber 300.

The substrate 10 can be transported by a transport mechanism, between the chambers 100, 200 and 300.

In this embodiment, the substrate 10 is first transported into the first chamber 100 and then set on the stage 01. Then, the resist application mechanism 102 applies resist droplets 20 to the substrate 10, at those desired positions on the substrate 10, at which the template will be pressed onto the substrate 10.

Next, the transport mechanism transports the substrate 10 into the second chamber 200. In the second chamber 200, the substrate is set on the stage 201. A heat treatment is the performed, thereby reducing the volume of each resist droplet 20 formed on the substrate 10. Instead, the resin droplets may be left at room temperature if the second resin component contained in every resist droplets 20 evaporates quickly enough at room temperature.

Then, the transport mechanism transports the substrate 10 into the third chamber 300. In the third chamber 300, the substrate 10 is set on the stage 301. The template 30 is pressed onto the substrate 10 holding the resin droplets reduced in volume. At the same time as the template 30 is pressed onto the substrate 10 or with some time lag, UV light is applied from the UV light source 302 to the resist droplets 20, thereby curing the resist 21. Thereafter, the template 30 is separated from the pattern made of resist 21 cured. As a result, a desired resist pattern is formed.

In this embodiment, the second resin component of each resist droplet 20 fully evaporates in the second chamber 200 during a period between the step of applying the resist to the substrate 10 and the step of pressing the template 30 onto the substrate 10. Once the template has been pressed onto the substrate, the resist 21 has its RLT well controlled and can thus be thin. This can contribute to the enhancement of the dimensional precision of the pattern formed by imprinting. Further, the second chamber 200, which functions as a resist-volume reduction unit, can prevent the template 30 and the alignment optical system from contaminated with the second resin component that has evaporated.

Fifth Embodiment

In the third embodiment, the second resin component evaporates quickly enough at room temperature. In contrast, this embodiment takes some measures against a decrease in the throughput of the imprinting apparatus, which may result because the second resin component slowly evaporates at room temperature. Hence, the imprinting apparatus has such a resist-volume reduction unit as shown in FIG. 5 that shows the fourth embodiment.

The first measure is to arrange the components of the resist-volume reduction unit parallel to one another. That is, a plurality of second chambers 200 are arranged parallel to one another. The substrates 10 processed in the first chamber 100 are inserted, one after another, into the second chambers 200, respectively. The substrates 10 are then transported into the third chamber 300, one by one, in the order they have been subjected to the evaporation process.

The second measure is to provide an infrared heater 202 in each the second chamber 200, as in the fourth embodiment, to heat the substrate 10 holding the resist material, thereby to evaporate the second resin component at a higher speed than otherwise. The substrate 100 may be heated to 100° C. or less, preferably about 50 to 80° C. This is because the first and third resin components, which do not evaporate at room temperature in effect, may evaporate at a high process temperature and may inevitably impair the size control.

The resist-volume reduction unit comprises a heating mechanism configured to heat the substrate 10, a substrate cooling mechanism configured to cool the substrate 10 subjected to a prescribed process, and a transport mechanism configured to transport the substrate 10. A typical type of the heating mechanism has a heating plate similar to one used in the resist coating/developing apparatus. Preferably, the heating mechanism is a proximity heating type that does not contact any heating plate. A heating mechanism that emits radiation such as infrared beams may be used instead. Such a heating mechanism should, of course, emit invisible beams that cure UV-curable resins.

The third measure is to make the third resin component evaporate quickly in a pressure-reduced chamber. In this case, the pressure in the pressure-reduced chamber (and the temperature of the substrate) must be adjusted to prevent the first and third resin components from evaporating.

Thus, in this embodiment, the decrease in the throughput of the imprinting apparatus can be suppressed even if the second resin component evaporates a low speed at room temperature, because the resist-volume reduction unit is configured not to reduce the throughput of the apparatus.

Sixth Embodiment

This embodiment differs from the first to fifth embodiments, in that the resist material used does have volatility and the resist material applied to the substrate is reduced in volume, nonetheless.

More specifically, after the resist material has been applied to the substrate, a solution is applied, dissolving the resist material to some extent, and the solution is removed from the substrate upon lapse of a prescribed time after the application of the solution.

It may be necessary to eject the resist material must in an amount of 1 pL or less as described above. In this case, the resist droplet formed on the substrate has a diameter of tens of microns to several microns. Assume that the imprinting apparatus has a throughput of about 10 wph. Then, the resist-volume reduction process needs to be performed within about 5 minutes by using the solution. Therefore, it is desirable to dissolve the resist material at the rate of tens of nanometers per second.

Acrylic resin or unsaturated polyester derivative, which is used in the UV-curable resin, exhibits solubility to many organic solvents. As organic solvents of this type, PGMEA, PGME, cyclohexane, cyclopentane and MIBC, for example, can be exemplified. Not a single solvent, but a mixture of solvents may be used to adjust the dissolving speed.

As organic solvents, there can be exemplified: alcohols, ethers, glycol ethers, ethylene ethers, ethylene glycol alkylether acetates, diethylene glycols, propylene glycol alkylether acetates, aromatic hydrocarbons, ketones and esters.

More specifically, alcohols are methanol, ethanol, etc.; and ethers are tetrahydrofuran, etc. Glycol ethers are ethylene glycol monomethyl ether, ethylene glycol dimethyl ether, ethylene glycol methyl ethyl alcohol, ethylene glycol monoethyl ether, etc. Ethylene glycol alkylether acetates are methyl cellosolve acetate, ethyl cellosolve acetate, etc. Diethylene glycols are diethylene glycol monomethly ether, diethylene glycol diethyl ether, diethylene glycol dimethyl ether, diethylene glycol ethyl methyl ether, diethylene glycol monoethyl ether, diethylene glycol monobutyl ether, etc. Propylene glycol alkylether acetates are propylene glycol methyl ether acetate and propylene glycol methyl ether acetate. Aromatic hydrocarbons are toluene, xylene, etc. Ketones are acetone, methyl ether ketone, methyl isobutyl ketone, cyclohexanone, 4-hydroxy-4-metyl-2-pentanone, 2-heptanone, etc. Esters are 2-hydroxy ethyl propionate, 2-hydroxy-2-methyl methyl propionate, 2-hydroxy-2-methyl ether propionate, ethoxy ethyl acetate, hydroxyl ethyl acetate, 2-hydroxy-2-methylbutanoate methyl, 3-methoxy propionate methyl, 3-methoxy propionate ether, 3-ethoxy propionate methyl, 3-ethoxy propionate ether, ethyl acetate, butyl acetate, methyl lactate, ethyl lactate, etc.

In this embodiment, the resist-volume reduction unit must exist between the resist application unit and the template pushing unit as shown in FIG. 5.

It is desirable to supply the organic solvent to the substrate on which resist droplets are mounted, while preventing the resist film from moving or peeling as the organic solvent flows. To be more specific, the organic solvent is supplied in the form of liquid film by using a slit-type nozzle, or in the form of mist. An exemplary method of removing the solvent that has dissolved the resist film is to rotate the substrate at about hundreds of rotations per minute (rpm) at most, thereby to prevent the resist material from moving as the solvent flows. Alternatively, the substrate may be subjected rinsing using solvent that does not dissolve the resist material in effect and scarcely enters the interface between the resist material and the substrate. If the resist material is water-insoluble, water is an example of the rinse solution.

In this embodiment, a part of each resist droplet is thus removed from the substrate 10 by using solution, thereby uniformly controlling the resist droplets in terms of volume as in any other embodiment. This embodiment can therefore achieve the same advantages as any other embodiment.

Modified Embodiment

The present invention is not limited to the embodiments described above. The first resin component, second resin component and coupling reaction initiator that constitute the resist material are not limited to those used in the embodiments. They can be changed to others, if necessary, in accordance with the specification. Further, the ratio of the second resin component may be determined from the relation between the size of each resist droplet formed by, for example, an ink-jet head and the size of each resist droplet finally mounted on the substrate.

The resist material need not be applied to the substrate, in the form of liquid droplets. The resist material only needs to have some flowability.

The imprinting apparatus is not limited to those shown in FIG. 4 and FIG. 5. It only needs to have a resist application mechanism for applying resist to a substrate, a resist-volume reduction mechanism for reducing the volume of each resist droplet on the substrate, and an imprinting mechanism for pressing a template onto the resist, curing the resist and separating the template. Moreover, the imprinting is not limited to UV imprinting that uses UV-curable resin. It can, of course, be thermal imprinting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method comprising:
   applying a plurality of resist droplets for imprinting to a substrate discretely in space, the resist droplets including a first resin component that is nonvolatile, a second resin component that is volatile, and a coupling reaction initiator that promotes curing of the first resin component;
   causing the second resin component in the plurality of resist droplets applied to the substrate discretely to evaporate, thereby reducing the resist droplets in volume and keeping the resist droplets discrete;
   imprinting a pattern surface of a template onto, in the order of resist drop application, a shot of the resist droplets, the resist droplets which are reduced in volume due to the second resin component that has evaporated and are discrete, the resist droplets being transformed to a resist film by the imprinting;
   curing the resist film while keeping the pattern surface of the template imprinted onto the resist film; and
   separating the template from the resist film after the resist film has been cured,
   wherein during the imprinting a pattern surface of a template onto the resist droplets reduced in volume in the shot, resist droplets for imprinting are applied onto the substrate discretely in space in another shot.

2. The method according to claim 1, wherein the volume of the resist droplets is reduced by leaving the resist droplets to stand longer than a prescribed time or by performing a heat treatment on the resist droplets.

3. The method according to claim 1, wherein the resist droplets are applied to the substrate by ejecting the resist droplets to the substrate by an ink-jet nozzle.

4. The method according to claim 1, wherein the patterned resist film between the substrate and the patterned template is cured by applying ultraviolet light.

5. The method according to claim 1, wherein applying the plurality of resist droplets for imprinting to the substrate discretely in space comprises:
 applying a lower number of resist droplets on a region of the substrate corresponding to a position wherein a densely-patterned region of the template is to be imprinted as compared to a number of resist droplets on a region of the substrate corresponding to a position wherein a sparsely-patterned region of the template is to be imprinted; and
 applying the resist droplets in the same volume, wherever they are applied on the substrate.

* * * * *